(12) United States Patent
Kaufmann et al.

(10) Patent No.: US 10,018,684 B2
(45) Date of Patent: *Jul. 10, 2018

(54) SENSOR DEVICE

(71) Applicant: TDK-Micronas GmbH, Freiburg (DE)

(72) Inventors: Timo Kaufmann, Waldkirch-Suggental (DE); Joerg Franke, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 553 days.

This patent is subject to a terminal disclaimer.

(21) Appl. No.: 14/683,893

(22) Filed: Apr. 10, 2015

(65) Prior Publication Data

US 2015/0293185 A1  Oct. 15, 2015

(30) Foreign Application Priority Data

Apr. 10, 2014 (DE) .................. 10 2014 005 319
Feb. 10, 2015 (DE) .................. 10 2015 001 553

(51) Int. Cl.
*G01R 33/00* (2006.01)
*G01D 5/14* (2006.01)
*G01D 3/036* (2006.01)
*G01D 5/244* (2006.01)
*F02N 11/08* (2006.01)

(52) U.S. Cl.
CPC ....... *G01R 33/0017* (2013.01); *G01D 3/0365* (2013.01); *G01D 5/145* (2013.01); *G01D 5/24485* (2013.01); *F02N 11/0814* (2013.01); *F02N 2200/021* (2013.01)

(58) Field of Classification Search
CPC .......... G01D 5/24485; F02N 2200/021; F02N 11/0814
See application file for complete search history.

(56) References Cited

U.S. PATENT DOCUMENTS

| 6,288,533 | B1 | 9/2001 | Haeberli et al. |
| 7,808,234 | B2 | 10/2010 | Kurihara |
| 8,680,847 | B2 | 3/2014 | Franke et al. |

(Continued)

FOREIGN PATENT DOCUMENTS

| EP | 0 916 074 B1 | 7/2003 |
| EP | 1 909 074 A1 | 4/2008 |

(Continued)

*Primary Examiner* — Jermele M Hollington
*Assistant Examiner* — Alvaro Fortich
(74) *Attorney, Agent, or Firm* — Muncy, Geissler, Olds & Lowe, P.C.

(57) ABSTRACT

A sensor device for suppressing a magnetic stray field, having a semiconductor body with a surface, formed in an x-y plane, and a back surface. Each circle half of a disk-shaped magnet has two magnetic poles and the magnet is rotatable relative to the IC housing around a z-direction. An imaginary lengthening of the axis penetrates the magnet in the center of gravity of the main extension surface of the magnet. A first pixel cell and a second pixel cell are integrated into the surface of the semiconductor body together with a circuit arrangement, and each pixel cell has a first magnetic field sensor and a second magnetic field sensor. The first pixel cell is spaced apart from the second pixel cell along a connecting line, and the first pixel cell in a projection along an imaginary lengthening of the axis is arranged within the two inner circle segments.

15 Claims, 2 Drawing Sheets

(56) References Cited

U.S. PATENT DOCUMENTS

| | | | |
|---|---|---|---|
| 2010/0148764 A1 | 6/2010 | Abe et al. | |
| 2011/0128528 A1* | 6/2011 | Al-Rawi | B62D 6/10 356/138 |
| 2011/0128529 A1* | 6/2011 | Al-Rawi | G01D 5/3473 356/139 |
| 2011/0291645 A1* | 12/2011 | Franke | G01D 5/145 324/207.2 |
| 2011/0291650 A1* | 12/2011 | Franke | G01D 5/145 324/251 |
| 2012/0256283 A1* | 10/2012 | Franke | H01F 5/00 257/427 |
| 2014/0084906 A1* | 3/2014 | Ruigrok | G01D 5/147 324/207.21 |

FOREIGN PATENT DOCUMENTS

| | | |
|---|---|---|
| GB | 2505226 A | 2/2014 |
| JP | 2005-024282 A | 1/2005 |
| WO | WO 2010/060607 A2 | 6/2010 |

* cited by examiner

SENSOR DEVICE

This nonprovisional application claims priority under 35 U.S.C. § 119(a) to German Patent Application No. 10 2014 005 319.9, which was filed in Germany on Apr. 10, 2014, and German Patent Application No. 10 2015 001 553.2, which was filed in Germany on Feb. 10, 2015, and which are both herein incorporated by reference.

BACKGROUND OF THE INVENTION

Field of the Invention
The present invention relates to a sensor device.
Description of the Background Art
A sensor device for determining the rotation angle of a shaft is known from EP 0 916 074 B1, which corresponds to U.S. Pat. No. 6,288,533.

Furthermore, an IC housing with an integrated circuit and a magnetic sensor is known from WO 2010/060607 A2, which corresponds to U.S. Pat. No. 8,680,847, which is incorporated herein by reference. A permanent magnet whose magnetic flux penetrates the sensor is arranged adjacent to the package.

Furthermore, magnetic field measuring devices and arrangements are known from JP 2005024282 A, GB 2505226 A, US 2010/0148764 A1, and EP 1909 074 A1, which corresponds to U.S. Pat. No. 7,808,234.

SUMMARY OF THE INVENTION

It is therefore an object of the present invention to provide a device that refines the prior art.

According to an embodiment of the invention, a sensor device is provided for suppressing a magnetic stray field, comprising a semiconductor body with a surface, formed in an x-y plane, and a back surface, whereby the x-direction and the y-direction are formed orthogonal to one another, and the semiconductor body is arranged on the substrate or the back surface of the semiconductor body is connected to a substrate, and an axis formed in a z-direction, whereby the z-direction is formed orthogonal to the x-y plane, and a magnet is provided, whereby the magnet has a planar main extension surface in the direction of the x-y plane, and the IC housing is spaced apart from the main extension surface of the magnet such that the surface of the semiconductor body is oriented parallel to the main extension surface of the magnet, and the magnet has a magnetization with four magnetic poles in the direction of the x-y plane, and two magnetic poles as outer circle segments surround the two inner magnetic poles as circle segments, so that each circle half of the disk-shaped magnet has two magnetic poles, and whereby the magnet is rotatable relative to the IC housing around the z-direction, and an imaginary lengthening of the axis penetrates the magnet in the center of gravity of the main extension surface of the magnet, whereby a first pixel cell and a second pixel cell are integrated into the surface of the semiconductor body together with a circuit arrangement, and each pixel cell has a first magnetic field sensor and a second magnetic field sensor, and whereby the first magnetic field sensor detects a magnetic field in the x-direction and the second magnetic field sensor a magnetic field in the y-direction, and the first pixel cell is spaced apart from the second pixel cell along a connecting line, and the first pixel cell in a projection along the imaginary lengthening of the axis is arranged within the two inner circle segments.

An arrangement with four magnetic poles can be called a quadrupole arrangement. It can also be understood further that a signal, dependent on the strength of the magnetic field, can be induced by the magnet in the magnetic field sensors. If the IC housing is rotated relative to the magnet, the signals of the magnetic field sensors have a sinusoidal or cosinusoidal shape.

An advantage of the device of the invention is that both the rotation angle of a stationary axis or particularly a shaft, as well as the rotation angle of a rotating axis or especially a shaft, can be determined by spacing apart two pixel cells with the particular two-dimensional design of the magnetic field sensors in conjunction with the quadrupole arrangement of the magnet. Stated differently, the sensor device can be used for detecting the rotation angle of the shaft. For this purpose, the signals of the magnetic field sensors are processed with a differential evaluation method; i.e., the rotation angle of the axis or particularly the shaft can be determined from the signal differences between the first pixel cell and the second pixel cell and from the predetermined magnetic pole arrangement. In particular, in an automatic start-stop system of a motor vehicle, the position of the crankshaft or the position of the camshaft can be determined hereby in the case of an idle engine as well. Turning on of the engine can be made easier by this. A further advantage is that the effects of a stray field, for example, due to the Earth's magnetic field or power cables in electric/hybrid vehicles, which have high currents, for example, above 10 amperes, can be suppressed in a simple and reliable manner by the double design of the magnetic field sensors both in the x-direction and in the y-direction. As a result, the device of the invention can be used for suppressing magnetic DC field components.

In an embodiment, in the projection the axis penetrates the semiconductor body, for example, in a vicinity of the first pixel cell. In a further embodiment, in the projection along the imaginary lengthening, the axis penetrates the first pixel cell and/or furthermore the second pixel cell is arranged between the two inner circle segments and the two outer circle segments.

In an embodiment, each pixel cell can include a third magnetic field sensor, whereby the third magnetic field sensor detects a magnetic field in the z-direction and, in this case, the z-direction is formed orthogonal to the x-direction and orthogonal to the y-direction, so that each pixel cell is made as a 3-dimensional magnetic field sensor. Tests have shown that it is advantageous to arrange each of the two pixel cells near an outer edge of the semiconductor body in order to create hereby a large distance to one another. It is clear that the accuracy of the angle determination of the shaft can be increased with an increasing distance between the two pixel cells. In a further embodiment, an integrated circuit is formed on the semiconductor body between and/or next to the two pixel cells, whereby the integrated circuit has an electrical functional connection to the two pixel cells. In particular, with the integrated circuit the magnetic field sensors can be supplied with an operating current and can evaluate the signal induced by the applied magnetic field.

In an embodiment, the magnetic field sensors in the pixel cell can have a common center of gravity in order to determine the magnetic flux of the particular spatial direction at the same point. The particular common center of gravity in the present case is understood as the intersection point of the two magnetic field sensors in one of the pixel cells. It should be understood that the intersection point lies in the middle of the particular magnetic field sensor; i.e., the remaining lengths of the particular sensor are equally long on both sides of the intersection point. In an embodiment, the magnetic field sensors each have a main extension surface, whereby the main extension surfaces of the magnetic field sensors are formed orthogonal to one another or in pairs at right angles to one another.

Tests have shown that it is advantageous to configure the magnetic field sensors as Hall sensors formed orthogonal to one another and, in this case, to arrange two of the Hall sensors as vertical Hall sensors; i.e., the main extension surface of each of the two vertical Hall sensors is configured perpendicular to the surface of the semiconductor body. Preferably, the third Hall sensor has a main extension surface formed parallel to the surface of the semiconductor body. The Hall sensors in each case can be formed as Hall plates.

In a further embodiment, the magnet can be configured as a circle in the x-y plane, whereby the radius of the circle is greater than half the length of the connecting line or, provided the magnet is not configured as a ring magnet, the magnet is configured as a square and half of the diagonal of the square is greater than half the length of the connecting line or alternatively the diameter of the circle or the diagonal of the square is greater than half the length of the connecting line.

As a result, the pixel cells, in a projection along an imaginary extension in the z-direction, are covered by the surface of the magnet and the sensitivity of the device is increased. The two outer circle segments can be equal in size and the inner circle segments can be equal in size.

In an embodiment, the first pixel cell in a projection along the z-axis can be arranged within the two inner magnetic poles, made as circle segments, and the second pixel cell can be arranged within the outer circle segment. It is sufficient in this case that the semiconductor body is arranged next to the imaginary lengthening of the axis and particularly is not penetrated by the imaginary lengthening of the axis.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
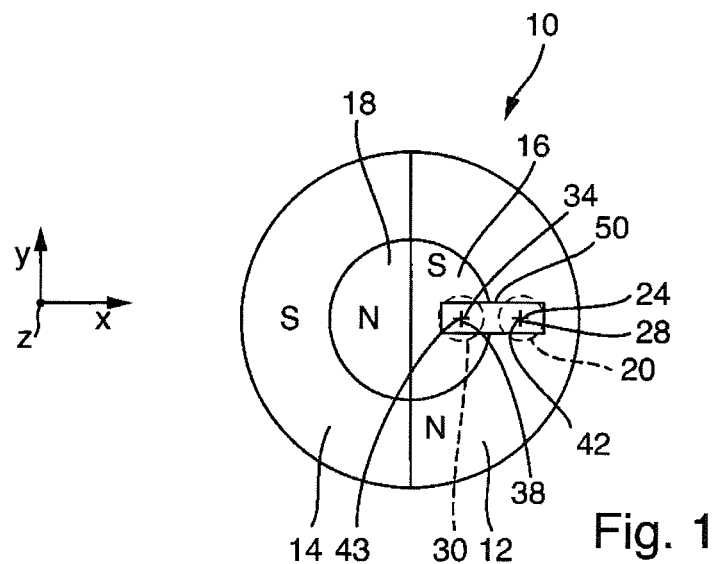
FIG. 1 shows a top plan view of a magnet with four magnetic poles.

The illustration in FIG. 1 shows a top plan view of a magnet 10 with four magnetic poles 12, 14, 16, 18, whereby two magnetic poles 12, 14 as outer circle segments surround the two inner magnetic poles 16, 18 made as circle segments, so that each circle half of the disk-shaped magnet 10 has two magnetic poles 12, 14, 16, 18. It is understood that in the case of the four magnetic poles 12, 14, 16, and 18, two magnetic poles 12 and 18 each are formed as north poles and the other two magnetic poles 14 and 16 as south poles. Furthermore, a first pixel cell 20 is configured with a first magnetic field sensor 24 formed in an x-direction and with a second magnetic field sensor 28 formed in a y-direction, and a second pixel cell 30 is configured with a first magnetic field sensor 34 formed in the x-direction and a second magnetic field sensor 38 formed in the y-direction. First magnetic field sensors 24 and 34 are formed orthogonal to the respective second magnetic field sensors 28 and 38 and have a first center of gravity 42 formed in first pixel cell 20 and a further first center of gravity 43 formed in second pixel cell 30.

The Hall plates each have a main extension surface formed in a z-direction, whereby in the illustrated x-y plane only a projection onto a narrow side surface of the Hall plates is visible. First pixel cell 20 and second pixel cell 30 are formed in the surface of a semiconductor body 50. In this case, first pixel cell 20 in a projection along the z-axis is arranged within the two inner magnetic poles 16, 18, made as circle segments, and second pixel cell 30 is arranged within the outer circle segment.

Figure 2:
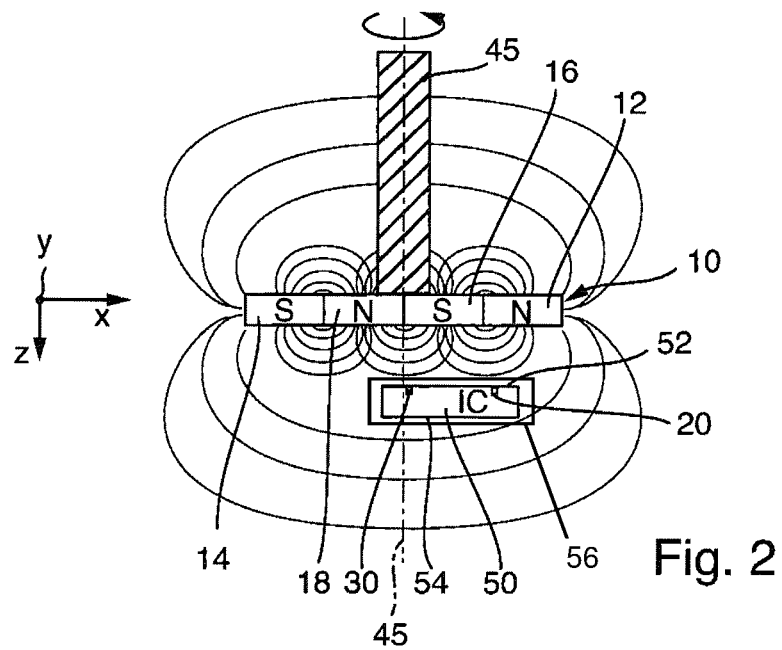
FIG. 2 shows a cut along an axis in a z-direction.

A cut along an axis 45 is shown in the illustration in FIG. 2. In this case, the cut shows a further arrangement of the semiconductor body relative to the projection along the z-axis. Axis 45 in the present case is configured as a shaft in the z-direction. Only the differences from the illustration in FIG. 1 will be explained below. In the present case, magnet 10 is arranged on a face side of a shaft. In an imaginary extension, the longitudinal axis of the shaft or axis 45 passes through magnet 10. Semiconductor body 50 is arranged next to the imaginary lengthening of axis 45. It should be noted that in this case semiconductor body 50 is not penetrated by the imaginary lengthening of axis 45. Semiconductor body 50 has a surface 52 and a back surface 54. Semiconductor body 50 is spaced apart from magnet 10 in the direction of the longitudinal axis. An integrated circuit (not shown) is formed on surface 52 of semiconductor body 50 between first pixel cell 20 and second pixel cell 30. Semiconductor body 50 is disposed in an IC housing 56. It is understood that the magnet and/or the IC housing can be rotated against one another around axis 45.

As soon as axis 45 or in the present case the shaft with the magnet rotates, a Hall voltage is induced in the Hall plates, provided an operating current flows through the Hall plates.

Figure 3:
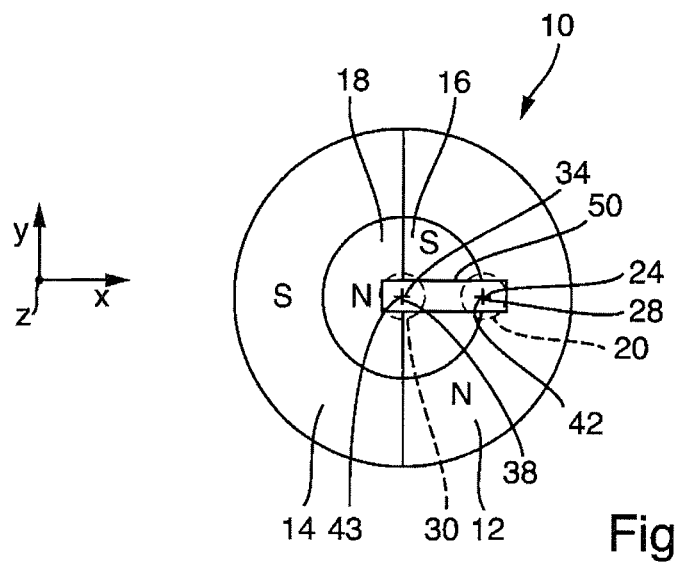
FIG. 3 is a top plan view of a further embodiment.

A top plan view of a further embodiment is shown in the illustration in FIG. 3. Only the differences to the preceding embodiments will be described below. Axis 45 in the imaginary lengthening penetrates first pixel cell 20, particularly the center of gravity of first pixel cell 20. Further, the two pixel cells 20 and 30 are spaced apart such that second pixel cell 30 is arranged between the two inner circle segments and the two outer circle segments. Tests have shown that with the arrangement the field lines of magnetic poles 12, 14, 16, 18 run parallel to the surface of semiconductor body 50.

Figure 4:
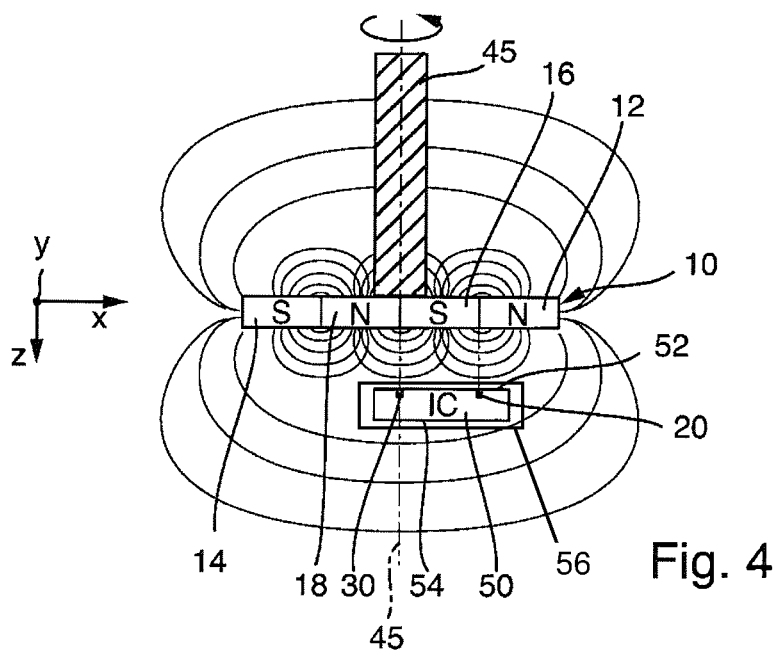
FIG. 4 shows a cut in a z-direction of the embodiment shown in FIG. 3.

FIG. 4 shows a cut along axis 45 of the embodiment shown in FIG. 3. First pixel cell 20 is penetrated by the imaginary lengthening of z-axis 45 and second pixel cell 30 by the imaginary lengthening of the projection line along the z-direction proceeding from a point on the boundary line between the two inner magnetic poles 16 and 18 and the two outer magnetic poles 12 and 14.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A sensor device for suppressing a magnetic stray field, the sensor device comprising:
    a semiconductor body with a surface formed in an x-y plane and a back surface, an x-direction and a y-direction are formed orthogonal to one another, the semiconductor body being arranged on a substrate;
    an axis formed in a z-direction, the z-direction being formed orthogonal to the x-y plane;
    a magnet that has a planar main extension surface in a direction of the x-y plane, an integrated circuit (IC) housing spaced apart from the main extension surface of the magnet such that the surface of the semiconductor body is oriented substantially parallel to the main extension surface of the magnet, the magnet having a magnetization with four magnetic poles in the direction of the x-y plane and two magnetic poles as outer circle segments surround the two inner magnetic poles as circle segments, so that each circle half of the magnet has two magnetic poles, the magnet being rotatable around the z-direction relative to the IC housing and an imaginary lengthening of an axis penetrates the magnet in a center of gravity of the main extension surface of the magnet;
    a first pixel cell; and
    a second pixel cell, the first and second pixel cells being formed in the surface of the semiconductor body together with a circuit arrangement,
    wherein each of the first and second pixel cells has a first magnetic field sensor and a second magnetic field sensor,
    wherein the first magnetic field sensor detects a magnetic field in the x-direction and the second magnetic field sensor detects a magnetic field in the y-direction,
    wherein the first pixel cell is spaced apart from the second pixel cell along a connecting line, and
    wherein the first pixel cell in a projection along the imaginary lengthening of the axis is arranged within the two inner magnetic poles as circle segments.

2. The sensor device according to claim 1, wherein in a projection the axis penetrates the semiconductor body.

3. The sensor device according to claim 1, wherein in a projection along the imaginary lengthening of the axis, the axis penetrates the first pixel cell or wherein the second pixel cell is arranged between the two inner magnetic poles as circle segments and the two magnetic poles as outer circle segments.

4. The sensor device according to claim 1, wherein each of the first and second pixel cells comprises a third magnetic field sensor, wherein the third magnetic field sensor detects a magnetic field in the z-direction and the z-direction is formed orthogonal to the x-direction and orthogonal to the y-direction, so that each pixel cell is made as a 3-dimensional magnetic field sensor.

5. The sensor device according to claim 1, wherein each of the two pixel cells is formed near an outer edge of the semiconductor body in order to create a large distance to one another.

6. The sensor device according to claim 1, wherein an integrated circuit is formed on the semiconductor body between and/or next to the two pixel cells, and wherein the integrated circuit has an electrical connection to the first and second pixel cells.

7. The sensor device according to claim 1, wherein the magnetic field sensors in the first pixel cell and the magnetic field sensors in the second pixel cell have a common center of gravity in order to determine a magnetic flux at a same point of each of the first and second pixel cell.

8. The sensor device according to claim 1, wherein the magnetic field sensors each have a main extension surface, and wherein the main extension surfaces of the magnetic field sensors are formed in pairs at substantially right angles to one another.

9. The sensor device according to claim 1, wherein the magnetic field sensors are formed as Hall sensors, and wherein two of the Hall sensors are formed as vertical Hall sensors and a main extension surface of each of the two vertical Hall sensors is formed substantially perpendicular to the surface of the semiconductor body.

10. The sensor device according to claim 4, wherein the third magnetic field sensor of each of the first and second pixel cells is configured as a Hall plate.

11. The sensor device according to claim 1, wherein the magnet is configured as a circle in the x-y plane, and wherein a radius of the circle is greater than half a length of the connecting line or wherein the magnet is configured as a square and half of a diagonal of the square is greater than half the length of the connecting line.

12. The sensor device according to claim 1, wherein the two magnetic poles as outer circle segments are each made equal in size and the inner magnetic poles as circle segments are each made equal in size.

13. The sensor device according to claim 1, wherein the sensor device detects a rotation angle of the magnet connected to the axis or to a shaft.

14. The sensor device according to claim 1, wherein the sensor device determines a rotation angle of the magnet connected to a stationary axis or to a shaft.

15. The sensor device according to claim 1, wherein the sensor device detects a rotation angle of the axis that penetrates the magnet in a center of gravity of the main extension surface of the magnet and a shaft for a differential operation.

* * * * *